US011756800B2

(12) United States Patent
Mavliev

(10) Patent No.: US 11,756,800 B2
(45) Date of Patent: Sep. 12, 2023

(54) METHODS AND SYSTEMS OF FORMING METAL INTERCONNECT LAYERS USING ENGINEERED TEMPLATES

(71) Applicant: Rashid Mavliev, Campbell, CA (US)

(72) Inventor: Rashid Mavliev, Campbell, CA (US)

( * ) Notice: Subject to any disclaimer, the term of this patent is extended or adjusted under 35 U.S.C. 154(b) by 149 days.

(21) Appl. No.: 17/219,250

(22) Filed: Mar. 31, 2021

(65) Prior Publication Data
US 2021/0305061 A1    Sep. 30, 2021

Related U.S. Application Data

(60) Provisional application No. 63/002,573, filed on Mar. 31, 2020.

(51) Int. Cl.
*H01L 21/48* (2006.01)
*H01L 23/528* (2006.01)
(Continued)

(52) U.S. Cl.
CPC .......... *H01L 21/485* (2013.01); *B29C 33/424* (2013.01); *C25D 5/022* (2013.01);
(Continued)

(58) Field of Classification Search
CPC ................... H05K 3/062; H05K 3/241; H05K 3/107–108; H01L 21/485; H01L 21/76873; H01L 21/7688; H01L 21/6835; H01L 21/68659; H01L 23/528; H01L 2224/95115; H01L 2221/1084; H01L 2221/68359; C25D 5/022; C25D 1/04; C25D 1/10; C25D 7/0678; C25D 17/001;
(Continued)

(56) References Cited

U.S. PATENT DOCUMENTS 7,732,329 B2   6/2010  Vasilev
8,012,875 B2   9/2011  Vasilev
(Continued)

OTHER PUBLICATIONS

International Application Serial No. PCT/US21/25183, Search Report and Written Opinion dated Jul. 8, 2021, 7 pgs.
(Continued)

*Primary Examiner* — Jose R Diaz
(74) *Attorney, Agent, or Firm* — Polygon IP, LLP

(57) ABSTRACT

Described herein are methods and systems for forming metal interconnect layers (MILs) on engineered templates and transferring these MILs to device substrates. This "off-device" approach of forming MILs reduces the complexity and costs of the overall process, allows using semiconductor processes, and reduces the risk of damaging the device substrates. An engineered template is specially configured to release a MIL when the MIL is transferred to a device substrate. In some examples, the engineered template does not include barrier layers and/or adhesion layers. In some examples, the engineered template comprises a conductive portion to assist with selective electroplating. Furthermore, the same engineered template may be reused to form multiple MILs, having the same design. During the transfer, the engineered template and device substrate are stacked together and then separated while the MIL is transitioned from the engineered template to the device substrate.

17 Claims, 14 Drawing Sheets

(51) Int. Cl.
- *H05K 3/10* (2006.01)
- *H05K 3/24* (2006.01)
- *H01L 21/683* (2006.01)
- *C25D 17/00* (2006.01)
- *C25D 5/02* (2006.01)
- *B29C 33/42* (2006.01)
- *H05K 3/06* (2006.01)
- *C25D 7/06* (2006.01)

(52) U.S. Cl.
CPC ......... *C25D 7/0678* (2013.01); *C25D 17/001* (2013.01); *H01L 21/6835* (2013.01); *H01L 23/528* (2013.01); *H05K 3/108* (2013.01); *H05K 3/241* (2013.01); *H01L 2221/1084* (2013.01); *H01L 2221/68359* (2013.01); *H01L 2224/95115* (2013.01); *H05K 3/062* (2013.01)

(58) Field of Classification Search
CPC .... C25D 17/005; C25D 17/007; B29C 33/30; B29C 33/424; B29C 33/44; B29C 33/56; B29C 37/0017; B29C 2037/0046; B29C 43/50; B29C 2043/5061–5092
See application file for complete search history.

(56) References Cited

U.S. PATENT DOCUMENTS

| | | |
|---|---|---|
| 9,365,946 B2 | 6/2016 | Busnaina et al. |
| 2016/0330837 A1 | 11/2016 | Coleman et al. |
| 2017/0194171 A1 | 7/2017 | Peterson et al. |
| 2017/0221851 A1 | 8/2017 | Mathews et al. |
| 2021/0175084 A1* | 6/2021 | Farooq ............... C25D 5/022 |

OTHER PUBLICATIONS

R. Mavliev, J. Gambino, "Evaluation of Selective Copper Deposition (Selectroplating)", AMC 2009 Proc, 35-44, 2010.

Rashid Mavliev et al, "Advanced Packaging Cost Reduction by Selective Copper Metallization"—2020 IEEE 70th Electronic Components and Technology Conference (ECTC).

Robert Rhoades et al, "Selective Metal Deposition to Decrease Cost and Increase Productivity"—2020 IEEE International Interconnect Technology Conference (IITC)—San Jose, California, Oct. 5-9, 2020 (Virtual).

Soo-Kil Kim et al, "Additive-Free Superfilling in Damascene Cu Electrodeposition Using Microcontact Printing"—Electrochemical and Solid-State Letters, 7 (9) C101-C103 (2004).

* cited by examiner

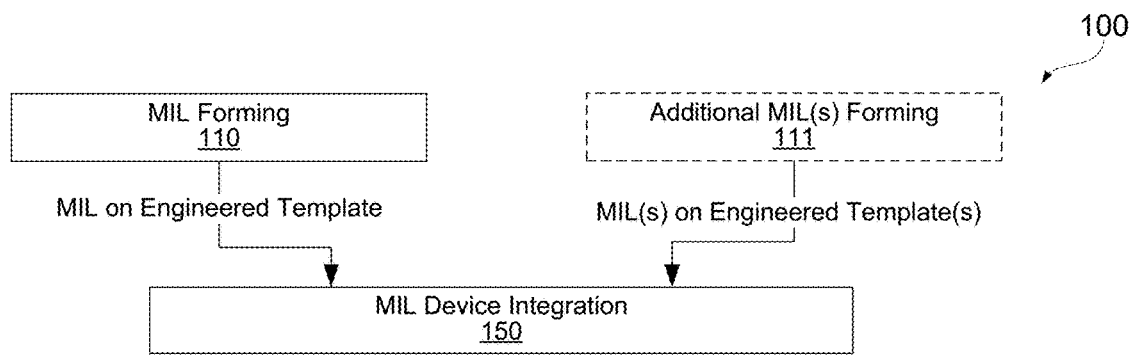
FIG. 1A
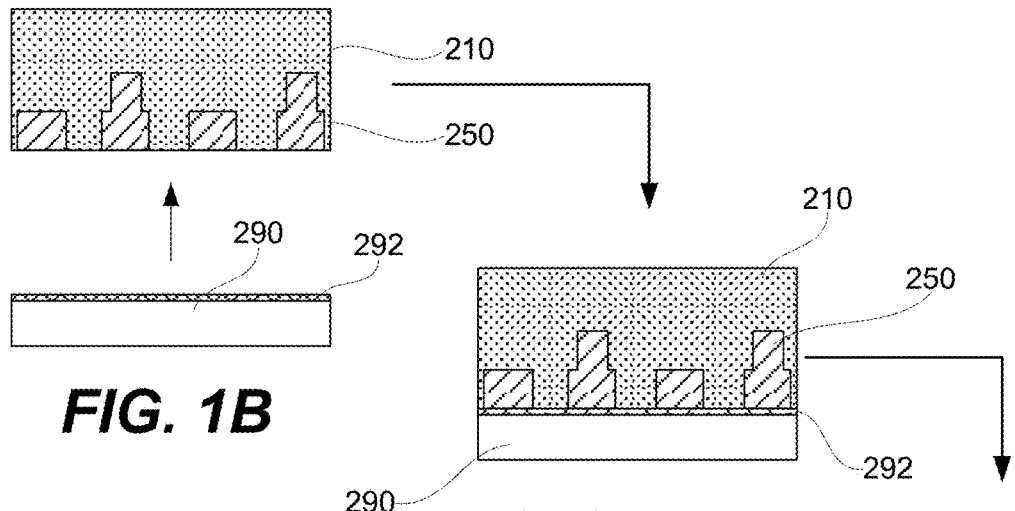
FIG. 1B
FIG. 1C
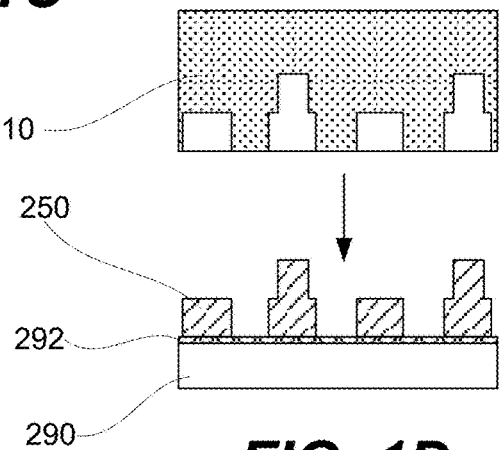
FIG. 1D

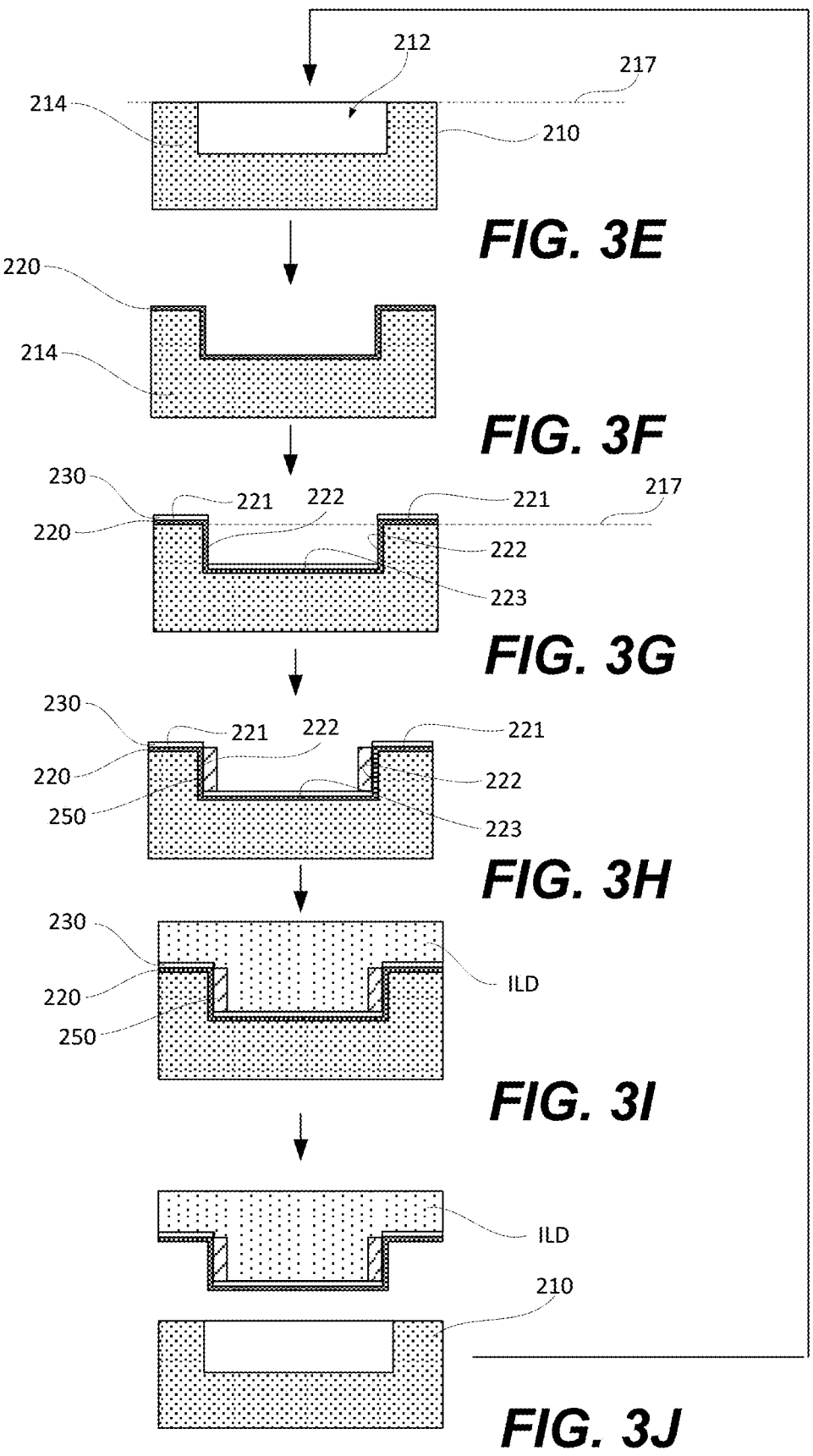

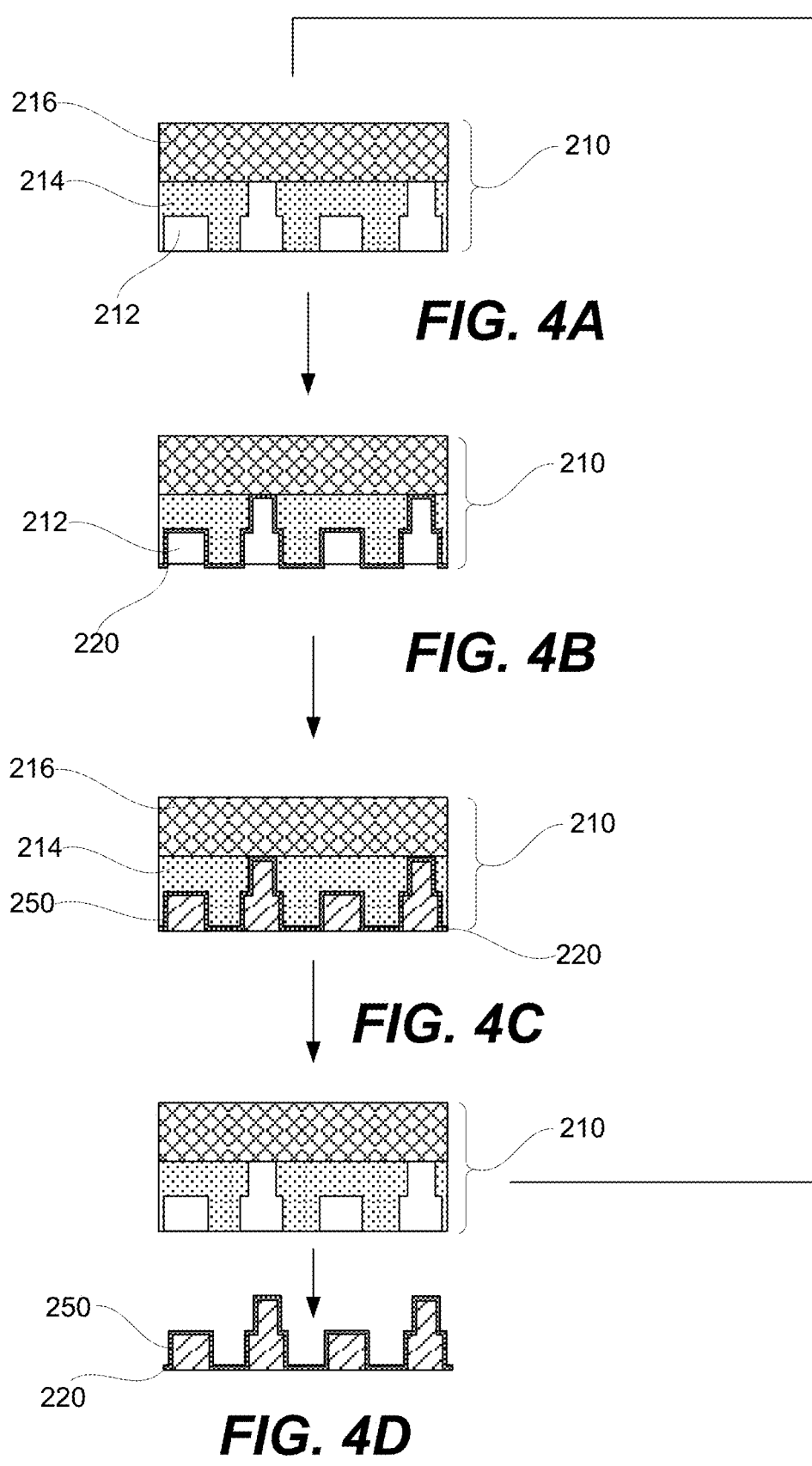

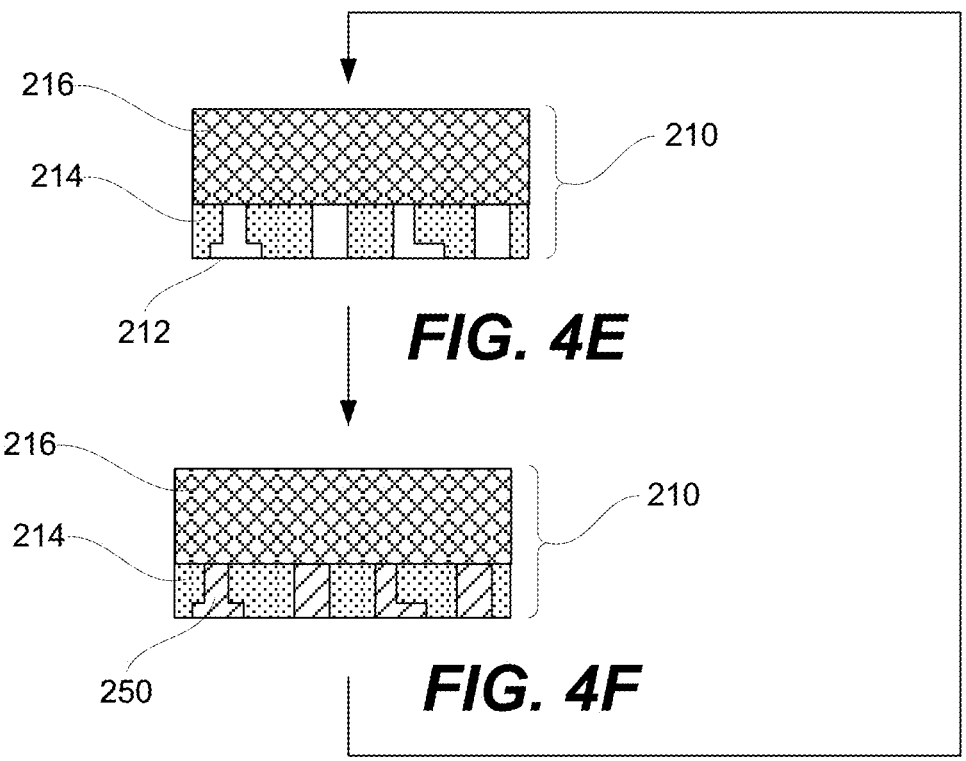
FIG. 4E
FIG. 4F
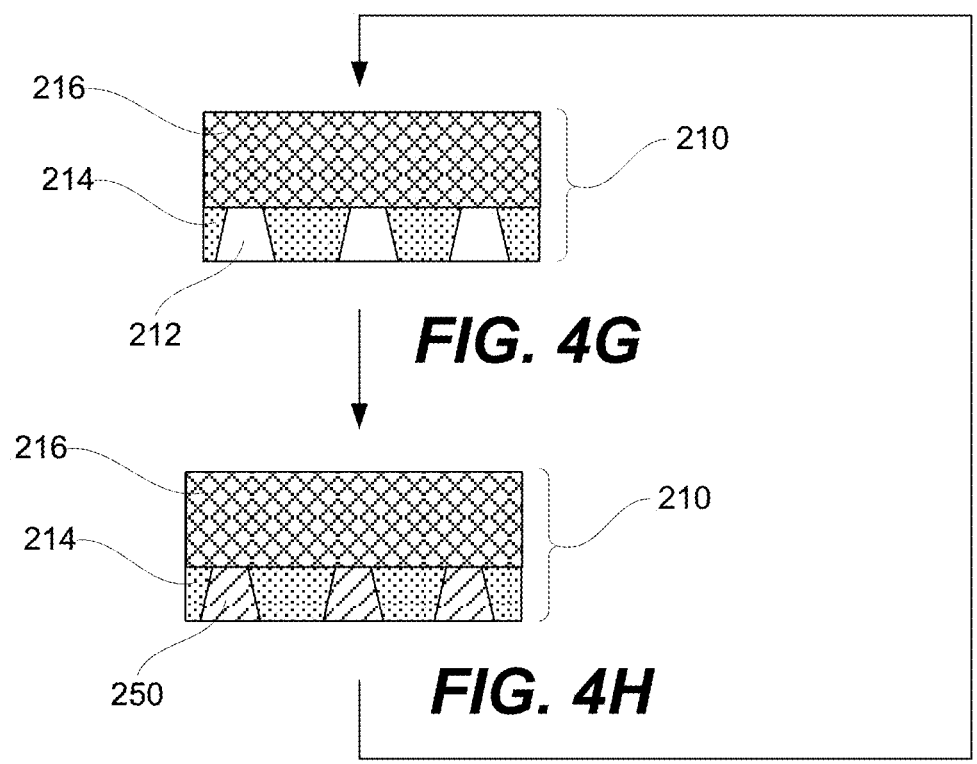
FIG. 4G
FIG. 4H

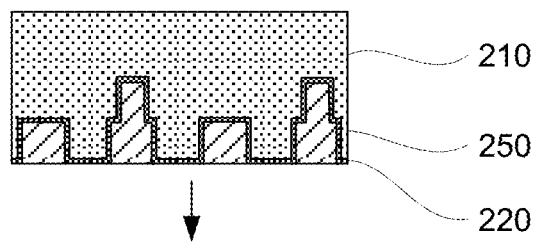
*FIG. 6A*
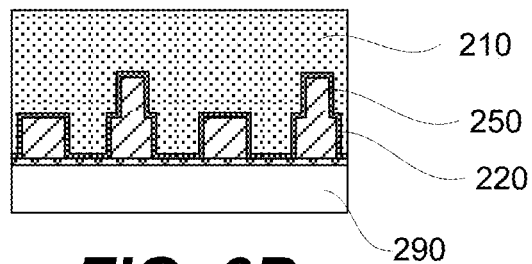
*FIG. 6B*
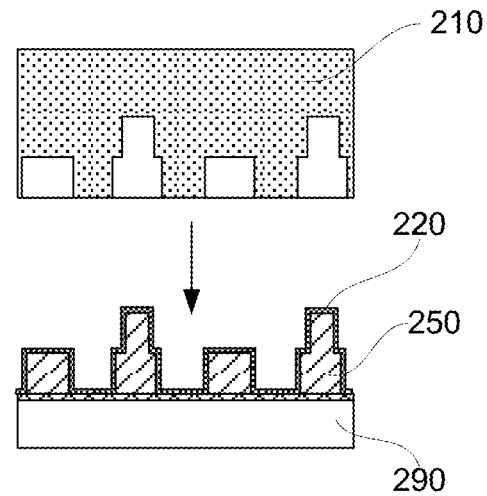
*FIG. 6C*
*FIG. 6D*
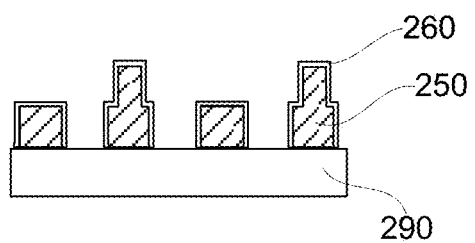
*FIG. 6E*
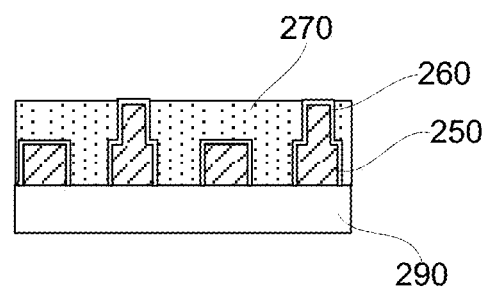
*FIG. 6F*
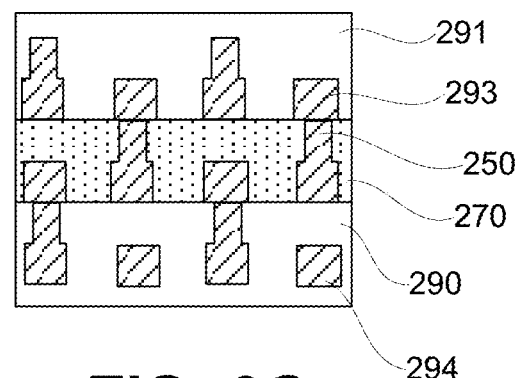
*FIG. 6G*

METHODS AND SYSTEMS OF FORMING METAL INTERCONNECT LAYERS USING ENGINEERED TEMPLATES

CROSS-REFERENCE TO RELATED APPLICATIONS

This application claims the benefit under 35 U.S.C. § 119(e) of U.S. Provisional Patent Application No. 63/002,573, filed on 2020 Mar. 31, which is incorporated herein by reference in its entirety for all purposes.

BACKGROUND

Manufacturing of electronic devices (e.g., semiconductor devices, displays, solar cells, sensors, electromagnetic shields, and wire grid polarizers) requires arranging and interconnecting, at a microscopic level, various active elements (e.g., diodes, transistors, resistors, capacitors, and inductors) and/or passive elements (e.g., electrical connectors and interconnects). Interconnect manufacturing is commonly performed by depositing electrically conductive materials on semiconductor wafers and other substrates. For example, a conductive material, such as copper, is electroplated onto a seed layer, which is previously formed on a wafer surface. Electroplating fills various features (e.g., vias and trenches) on the wafer surface (e.g., during damascene and dual-damascene processing).

However, these conventional processes require multiple steps and can be potentially damaging to device substrates, e.g., while interconnects are formed. The developments of flexible and stretchable inorganic electronics and the advancement in transfer printing eliminate some of the constraints associated with conventional processing. Specifically, these developments allow the integration of hard inorganic semiconductor materials into structural layouts with flexible substrates. This approach enables many new applications, such as curvilinear electronics, bio-integrated electronics, epidermal electronics, transient electronics, deformable optoelectronics, and many others. However, these new approaches have lower throughputs, lower resolutions, and other limitations that are generally not present in conventional semiconductor techniques. As such, these new approaches have not been widely adopted by the semiconductor industry and have limited general applicability because of these limitations.

What is needed are new solutions combining advantages of these new approaches with the established semiconductor manufacturing processes and techniques.

SUMMARY

Described herein are methods and systems for forming metal interconnect layers (MILs) on engineering templates and later transferring these MILs to device substrates. For purposes of this disclosure, the term "MIL" includes conductive lines (e.g., comprising metal, carbon nanotubes, and the like) as well as active circuit components, such as resistors, capacitors, inductors, diodes (e.g., organic light-emitting diodes), transistors, and the like. MILs are formed using semiconductor techniques, such as physical vapor deposition, electroplating/selective electroplating, etch-back, and the like. As such, the device substrates are not exposed to any processing conditions during the MIL forming, which opens new options for these substrates and also for the MIL forming operations. For example, the MIL forming may use various well-established semiconductor processing techniques that would be damaging to many new device substrate options. However, engineering templates used in the MIL forming, e.g., silicon wafers, are resistant to these semiconductor processing techniques.

Overall, this "off-device" approach to forming MILs reduces the complexity and costs of the overall process and also reduces the risk of damaging the device substrate. Device substrates can be also referred to as workpieces. Engineered templates are specifically selected to withstand the MIL forming conditions, such as seed layer deposition and electroplating (e.g., selective electroplating). Furthermore, the engineered templates are specially configured to release the MILs when the MILs are transferred to corresponding device substrates. Furthermore, the same engineered template may be reused to form multiple MILs, having the same design. Several engineered templates of the same design may be used to provide asynchronous operations of MIL formation and transfer. In some examples, the MIL is annealed and/or subjected to selective cobalt capping right on the engineered template before transfer to the workpiece. During the transfer, the engineered template and device substrate are stacked together and then separated, facilitating the transfer of manufactured MIL to a device substrate. In some cases, an additional carrier device can be used to transfer formed MIL from template to workpiece.

In some examples, a method of forming a transferable MIL, having a MIL design, for transferring to a device substrate, comprises depositing a seed layer on an engineered template. The engineered template comprises template features determined by the MIL design of the transferable MIL. The method also comprises selectively electroplating the transferable MIL into the template features over the seed layer. The adhesion of the seed layer to the engineered template is below an adhesion threshold, corresponding to the device substrate, thereby allowing to transfer of the transferable MIL from the engineered template to the device substrate while retaining the MIL design of the transferable MIL.

In some examples, the engineered template comprises a base material. In these examples, the seed layer directly interfaces the base material of the engineered template. In some examples, the engineered template comprises a base portion and a conductive portion. The template features are formed within the base portion. One or more of the template features protrudes to the conductive portion such that the conductive portion forms bottoms of the one or more of the template features. In some examples, the base portion of the engineered template comprises silicon oxide. The conductive portion of the engineered template comprises a low-resistivity silicon wafer.

In some examples, the seed layer and the transferable MIL are formed from substantially similar materials. Alternatively, the seed layer and the transferable MIL are formed from different materials.

In some examples, the method further comprises, prior to depositing the seed layer on the engineered template, forming an adhesion-control layer on the engineered template. For example, the adhesion-control layer is formed by depositing a silicon oxide layer over the engineered template, chemical treatment, or plasma treatment of the engineered template.

In some examples, the method further comprises, after depositing the seed layer on the engineered template, forming a blocking layer over the seed layer. The seed layer comprises first portions, second portions, and third portions. The first portions of the seed layer are disposed on the field of the engineered template and are covered with the blocking layer preventing electrochemical or electrophoretic deposition of material in that area. The second portions of the seed layer are disposed on the sidewalls of the template feature and are free from the blocking layer and remain exposed for material deposition after depositing the blocking layer. The third portions of the seed layer are disposed on the bottoms of the template feature and by design, may or may not be covered with the blocking layer. The transferable MIL is selectively electroplated or electrodeposited over the second and if specified, over the third portions of the seed layer and not over the first portion of the seed layer covered with the blocking layer.

In some examples, the method further comprises transferring the MIL from the engineered template.

Also provided a method of integrating a transferable metal interconnect layer (MIL) to a device substrate. In some examples, the method comprises forming an adhesion layer on the device substrate and transferring the transferable MIL from an engineered template to the device substrate. This transferring is performed by stacking the engineered template, comprising the transferable MIL, and the device substrate, comprising the adhesion layer, such that the transferable MIL contacts the adhesion layer. The transferring also involves separating the engineered template from the device substrate while the transferable MIL is retained by the adhesion layer on the device substrate and while the transferable MIL maintains a MIL design on the device substrate set by the engineered template.

In some examples, the adhesion layer comprises at least one of HMDS (hexamethyldisilazane), Ti-Prime, and diphenylsilanediol-derivatives, or diphenylsilanediol. In some examples, the adhesion layer has a thickness of between about 0.5 nm and 10000 nm.

In some examples, the engineered template and the transferable MIL form a stack further comprising a seed layer. After transferring the transferable MIL from the engineered template to the device substrate, the transferable MIL is covered by the seed layer. In these examples, the method further comprises, removing the seed layer of the transferable MIL thereby exposing the transferable MIL after transferring the transferable MIL from the engineered template to the device substrate.

In some examples, the method further comprises forming a selective capping layer on the transferable MIL such that the device substrate remains free from the selective capping layer.

Also provided is an engineered template for forming a MIL and transferring the MIL to a device substrate. The engineered template comprises a base portion and template features, protruding into the base portion and determined by a MIL design of the MIL. The template features are configured to receive the MIL. The surface of the template features is specifically selected such that adhesion of the MIL to the engineered template is below a threshold, corresponding to the device substrate, thereby allowing to transfer the MIL from the engineered template to the device substrate.

In some examples, the engineered template comprises silicon dioxide, forming the surface of the template features. In some examples, the engineered template is free from a barrier layer. In some examples, the engineered template comprises a base portion and a conductive portion such that the template features are formed within the base portion and selectively protrude up to the conductive portion. For example, the base portion of the engineered template comprises silicon oxide, and wherein the conductive portion of the engineered template comprises a low-resistivity silicon wafer.

BRIEF DESCRIPTION OF THE DRAWINGS

FIG. 1A is a schematic illustration of the overall process workflow, corresponding to "off-device" MIL forming followed by integrating the MIL into a device.

FIGS. 1B-FIG. 1D are schematic illustrations of different tools and components used for MIL forming, transferring, and integration into a device.

FIGS. 3E-3J are schematic representations of different processing stages of the method of FIG. 2, in accordance with some examples.

FIGS. 4A-4D are schematic representations of different processing stages of the method of FIG. 2, in accordance with some examples.

FIGS. 4E-4F and, separately, FIGS. 4G-4H are schematic representations of different processing stages of the method of FIG. 2, in accordance with some examples.

FIGS. 6A-6G represent different stages of the method of FIG. 5.

DETAILED DESCRIPTION

Figure 2:
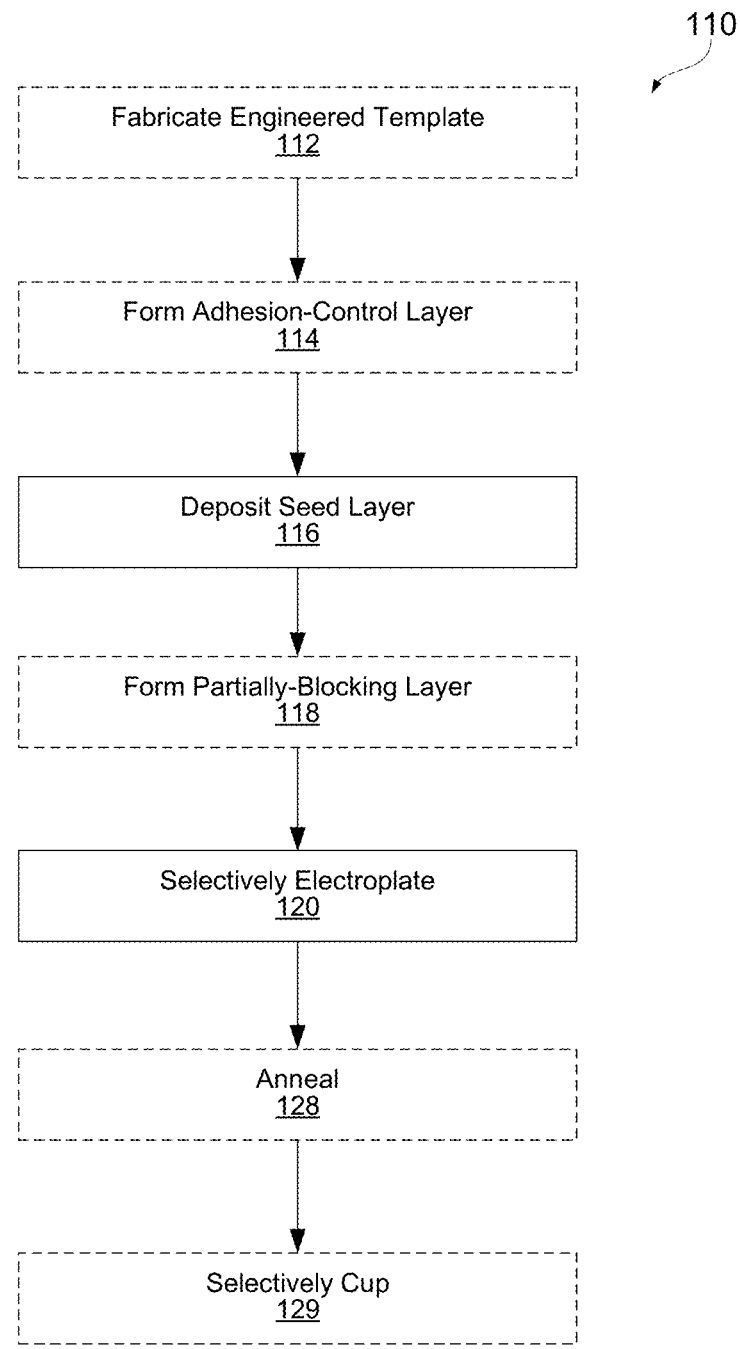
FIG. 2 is a process flowchart corresponding to a method of forming a MIL for transferring to a device substrate, in accordance with some examples.

In the following description, numerous specific details are outlined in order to provide a thorough understanding of the presented concepts. In some examples, the presented concepts are practiced without some or all of these specific details. In other instances, well-known process operations have not been described in detail to not unnecessarily obscure the described concepts. While some concepts will be described in conjunction with the specific examples, it will be understood that these examples are not intended to be limiting.

INTRODUCTION

MILs are used in different electronic and/or related devices, such as semiconductor chips, solar cells, displays, flexible electronics, and the like. For example, in addition to billions of transistors, an advanced chip comprises tens of miles of metal interconnects, positioned at multiple levels and interconnecting transistors and other components to each other. The chip performance depends, in large part, on signals and power transmission through these MILs. Often, a MIL becomes a limiting component in the chip or other electronic devices.

Conventionally, MILs are formed right on devices. This "on-device" approach requires subjecting the devices to many different process steps while forming MILs to interconnect these devices. First, each processing step adds to the overall device cost. Second, many of these steps involve harsh and stressful environments and conditions, which are potentially damaging to the resulting devices. Some examples of these steps include etching, polishing, high-temperature annealing or sintering, and the like. In some instances, these steps limit applications of MILs in various types of devices, e.g., an air-gap technology in dielectric layers.

Proposed methods and systems use engineered templates to form MILs, followed by transferring these metal interconnect layers to device substrates. These MILs may be referred to as transferable MILs. Specifically, a MIL is first formed on an engineered template, which comprises template features determined by the MIL design. Once formed, the MIL is transferred to the device substrate, e.g., to a specifically designated location on the device substrate and adhered to this device substrate. The MIL design and the transfer position of the MIL are determined by the position of devices on the substrate. With this "off-device" approach, the device substrate is not subjected to environments and conditions used to form MILs. This "off-device" approach not only preserves the integrity of the device substrate and any components positioned on the substrate but also helps to save on processing costs.

FIG. 1A is a schematic illustration of the overall process workflow 100, corresponding to the "off-device" MIL forming followed by integrating the MIL into a device. Specifically, workflow 100 comprises two separate processes, i.e., MIL forming (method 110) and MIL circuit integration (method 150). In some examples, a device may include multiple MILs. Therefore, the MIL forming process may be performed multiple times as schematically shown with block 111. At the same time, several engineered templates of the same design may be used to provide asynchronous operations of the MIL formation and transfer.

FIGS. 1B-FIG. 1D are schematic illustrations of different components used for MIL forming, transferring, and integration into a device. Specifically, FIG. 1B illustrates engineered template 210 with MIL 250, formed using engineered template 210. FIG. 1B also illustrates device substrate 290 before transferring MIL 250 to device substrate 290. Various examples of forming MIL 250 using engineered template 210 are described below with reference to FIG. 2. In some examples, device substrate 290 comprises adhesion layer 292.

FIG. 1C illustrates engineered template 210 and MIL 250 adhered to device substrate 290 or, more specifically, to adhesion layer 292 of device substrate 290. Engineered template 210 and adhesion layer 292 are configured in such a way that the adhesion of MIL 250 to device substrate 290 is greater than to engineered template 210. Therefore, when engineered template 210 is separated from device substrate 290, as schematically shown in FIG. 1D, MIL 250 remains on device substrate 290 and is separated from engineered template 210. At this point, engineered template 210 is ready for forming another MIL.

It should be noted that the MIL forming process (methods 110) and the MIL device integration (methods 150) may be performed by different entities. Therefore, various aspects of the circuit design may not be known at least to one entity or, in some examples, to both. This information separation provided by the "off-device" approach provides additional benefits.

MIL Forming Examples

FIG. 2 is a process flowchart corresponding to method 110 of forming MIL 250 for transferring to device substrate 290, in accordance with some examples.

In some examples, method 110 comprises fabricating (block 112 in FIG. 2) engineered template 210, which is an optional operation. Engineered template 210 comprises base portion 214 and template features 212. Template features 212 are determined by the design of MIL 250. Base portion 214 may be formed from silicon or silicon oxide (e.g., a silicon or silicon oxide wafer). In other examples, base portion 214 is formed from a plastic or dielectric material, arranged as a plate or as a film. Overall, base portion 214 is suitable for patterning and MIL formation techniques, further described below.

In some examples, engineered template 210 is a silicon wafer, used to support many standard semiconductor operations. In other examples, engineered template 210 is a roll, used for roll-to-roll processing while forming MIL 250 and also while transferring MIL 250 to device substrates.

Template features 212 may be formed by preparing the surface (e.g., polishing, cleaning) of base portion 214, depositing a photoresist layer, lithographic exposure of the desired pattern (corresponding to the MIL design), developing of the photoresist layer, clearing of undeveloped areas of the photoresist and clearing of openings, etching of the template in the openings to the desired depth, cleaning (e.g., ashing) of the remaining photoresist and cleaning of the formed pattern and template surface. This process may be repeated for dual damascene structures, which would include both trenches and vias. More advanced process steps may include forming etch stop layers.

It should be noted that the pattern of template features 212 on base portion 214 is a mirror image of the MIL pattern. As such, MIL 250, once is formed, is ready for the direct transfer to a device substrate as a mirror image. Alternatively, MIL 250 is ready for a two-step transfer as a direct image, e.g., with an intermediate assisted transfer on a temporary substrate.

In some examples, template features 212 have non-one dimensional shapes (e.g., an L-shape, S-shape, or T-shape) to promote the transferability of MIL 250 to device substrate 290 as, for example, is schematically shown in FIGS. 4E-4F. Specifically, the shapes are selected to increase the contact surface between MIL 250 and device substrate 290 thereby increasing the adhesion bond between MIL 250 and device substrate 290 and ensuring that MIL 250 is fully retained on device substrate 290 when engineered template 210 is removed.

In some examples, template features 212 have trapezoid and/or triangular shapes, which are open to the outer (contact) surface of engineered template 210 to promote the transferability of MIL 250 to device substrate 290 as, for example, is schematically shown in FIGS. 4G-4H.

Figure 3A:
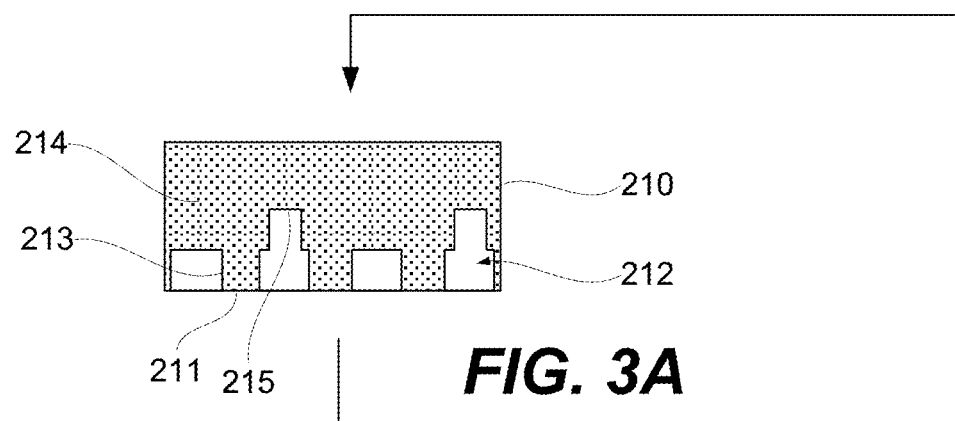
FIGS. 3A-3D are schematic representations of different processing stages of the method of FIG. 2, in accordance with some examples.

One example of engineered template 210 is shown in FIG. 3A. Engineered template 210 comprises base portion 214 having face surface 211. Engineered template 210 also comprises multiple template features 212, protruding into base portion 214 and away from face surface 211. Template features 212 correspond to the design/pattern of MIL 250, formed using engineered template 210. Template features 212 are defined by feature surfaces 213.

Another example of engineered template 210 is shown in FIG. 4A. In this example, engineered template 210 comprises base portion 214 and conductive portion 216. In this example, template features 212 are formed within base portion 214 and selectively protrude up to conductive portion 216. More specifically, conductive portion 216 forms bottoms of at least some of template features 212 as shown in FIG. 4A. Conductive portion 216 is used to assist with the electrofilling of template features 212 while forming MIL 250, as further described below.

In some examples, base portion 214 of engineered template 210 comprises at least one of silicon dioxide, silicon, plastic, dielectric, and other like materials. In the same or other examples, conductive portion 216 of engineered template 210 comprises at least one of low resistivity (doped) silicon.

In some examples, method 110 comprises forming (block 114 in FIG. 2) adhesion-control layer 215 on the surface of engineered template 210. Unlike barrier layers and adhesion-promoting layers used in conventional devices and techniques, adhesion-control layer 215 is used to reduce the adhesion between engineered template 210 and other layers formed on engineered template 210, such as seed layer 220. This adhesion reduction helps to maintain the integrity of MIL 250 when MIL 250 is separated from engineered template 210. In some examples, adhesion-control layer 215 is formed by depositing a silicon oxide layer over engineered template 210, chemical treatment, and/or plasma treatment of engineered template 210. In general, any surface-modifying treatment can be used to achieve the desired adhesion properties.

Figure 3B:
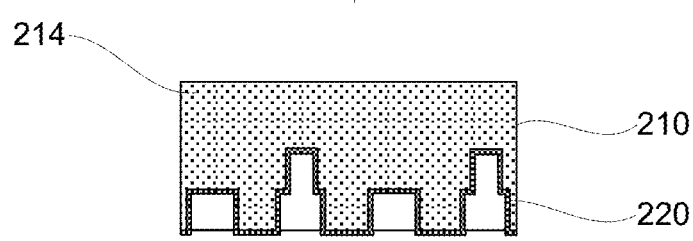

In some examples, method 110 comprises depositing (block 116 in FIG. 2) seed layer 220 on engineered template 210 as, e.g., is schematically shown in FIGS. 3B and 4B. As noted above, engineered template 210 comprises template features 212 determined by the design of MIL 250. Seed layer 220 is conformal and covers both feature surface 213 and face surface 211 of base portion 214. Seed layer 220 may be formed using a physical vapor deposition (PVD) technique. For example, a copper layer having a thickness from 50 to 100 nm may be used as seed layer 220. In some examples, seed layer 220 and MIL 250 are formed from substantially similar materials. For purposes of this disclosure, the term "substantially similar" refers to variations of the composition being less than 20% atomic or even less than 10% atomic. For example, both seed layer 20 and MIL 250 are formed from copper. Alternatively, seed layer 220 and MIL 250 are formed from different materials. In these examples, the composition of seed layer 220 and MIL 250 vary by more than 20% atomic. For example, seed layer 220 is formed from copper while MIL 250 is formed from gold.

In some examples, seed layer 220 is formed directly over and in contact with the base material (e.g., silicon dioxide) of engineered template 210. For purposes of this disclosure, the "base material" is defined as the main primary material of a structure such that at least 90% by volume of the structure is formed from the base material. The direct interface between the base material and the seed layer, in other words, there are no intermediate layers (e.g., diffusion barrier layers, adhesion layers, etc.) between seed layer 220 and engineered template 210. Unlike conventional substrates, which later become parts of devices, engineered template 210 is a reusable tool and is not integrated into any electronic devices. Therefore, there are no concerns with contamination of the base material (of engineered template 210, e.g., by metal diffusion of into engineered template 210.

Similarly, there are no concerns with strong bonds between seed layer 220 and engineered template 210. In fact, the adhesion strength between seed layer 220 and engineered template 210 and, later, between MIL 250, formed on and/or incorporating seed layer 220, and engineered template 210 should be less than between MIL 250 and device substrate 290 to allow transfer of MIL 250 from engineered template 210 to device substrate 290.

Special consideration can be taken for controlling the adhesion strength between MIL 250 and engineered template 210 by forming specific layers (e.g., adhesion-control layer 215) on engineered template 210, i.e., between engineered template 210 and seed layer 220. In some examples the specific layers on engineered template 210, i.e., between engineered template 210 and seed layer 220 can be formed to promote the electroless deposition of metal (copper) so PVD seed layer formation can be replaced by electroless copper seed layer formation.

In some examples, method 110 comprises forming (block 118) blocking layer 230 over seed layer 220 as, e.g., is schematically shown in FIG. 3G. In these examples, seed layer 220 comprises first portions 221, extending over the field of engineered template 210. Seed layer 220 also comprises second portions 222, covering the sidewalls of template features 212. Furthermore, seed layer 220 comprises third portions 222, covering the bottoms of template features 212 and extending between second portions 222. As shown in the FIG. 3G example, blocking layer 230 covers first portions 221 and third portions 223 of seed layer 220. Second portions 222 of seed layer 220 are free from blocking layer 230 and remain exposed depositing blocking layer 230 and before depositing MIL 250. In these examples, MIL 250 is selectively electroplated over second portions 222 of seed layer 220 and not over blocking layer 230 as, e.g., is schematically shown in FIG. 3H. In other words, MIL 250 is formed on the sidewalls of template features 212 and not on the bottoms of template features 212 or on the field of engineered template 210.

In other examples, blocking layer 230 does not extend into template features 212 and only covers the field of engineered template 210, extending between template features 212. In other words, in these examples, first portions 221 of seed layer 220 are covered with blocking layer 230, while second portions 222 and third portions 223 of seed layer 220 are free from blocking layer 230 and available for the MIL deposition. In these examples, MIL 250 completely fills each of template features 212, in a manner similar to FIG. 3C. Furthermore, blocking layer 230 prevents the deposition of the material (forming MIL 250) on the field of engineered template 210.

Figure 3C:
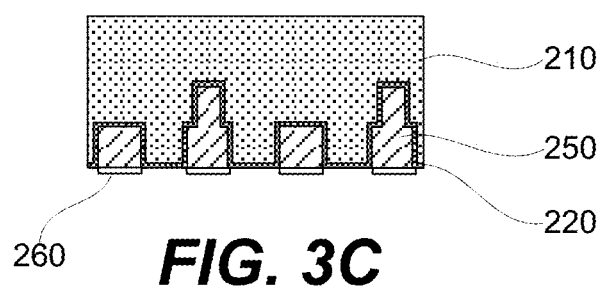

In some examples, method 110 comprises selectively electroplating (block 120 in FIG. 2) MIL 250 into template features 212. FIGS. 3C, 3H, and 4C illustrate engineered template 210 with MIL 250 at least partially filling template features 212. In some examples, e.g., FIGS. 3C and 4C, template features 212 are fully filled with MIL 250. In these examples, the width of template features 212 defines the width of MIL traces. Alternatively, e.g., FIG. 3H, template features 212 are partially filled with MIL 250. In this example, electroplating conditions (e.g., time, current, concentration, etc.) define the width of MIL traces. In some examples, the remaining portions of template features 212 (not filled with MIL 250) are later filled with an interlayer dielectric as, e.g., is schematically shown in FIG. 3I. Overall, these alternative examples may yield much narrowed MIL traces as, e.g., is shown FIGS. 3K and 3L.

As noted above, the adhesion strength between MIL 250 and engineered template 210 or, more specifically, between seed layer 220 and engineered template 210 should be less than the adhesion strength between MIL 250 and device substrate 290. This adhesion strength difference allows the transfer of MIL 250 from engineered template 210 to device substrate 290 while preserving the integrity of MIL 250 during the transfer. Overall, the adhesion strength of MIL 250 to engineered template 210 is below a set threshold, corresponding to device substrate 290.

In some examples, method 110 comprises annealing (block 128 in FIG. 2) MIL 250 on engineered template 210. Annealing is used to improve the quality of metal (copper) interconnects by advancing the grain structure of deposited material.

In some examples, method 110 comprises performing selective capping (block 129). This operation is optional. An example of capping layer 260 is shown in FIG. 3C. It should be noted that capping layer 260 is only formed over MIL 250. In this example, a portion of seed layer 220 extending between over MIL 250 remains free from capping layer 260. Capping layer 260 may help to improve the adhesion of MIL 250 to a device substrate, which is described below with reference to FIG. 5.

Figure 3D:
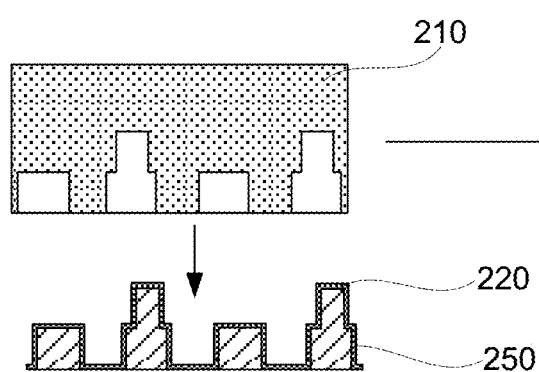
Figure 3K:
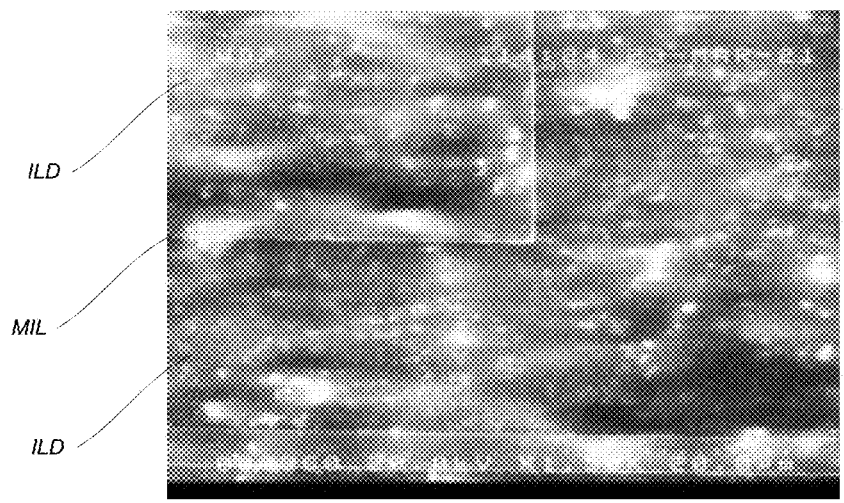
FIG. 3K is the scanning electron microscope (SEM) and FIG. 3L is the optical images of a MIL on a device substrate, formed in accordance with the operating steps shown in FIGS. 3E-3J.
Figure 3L:
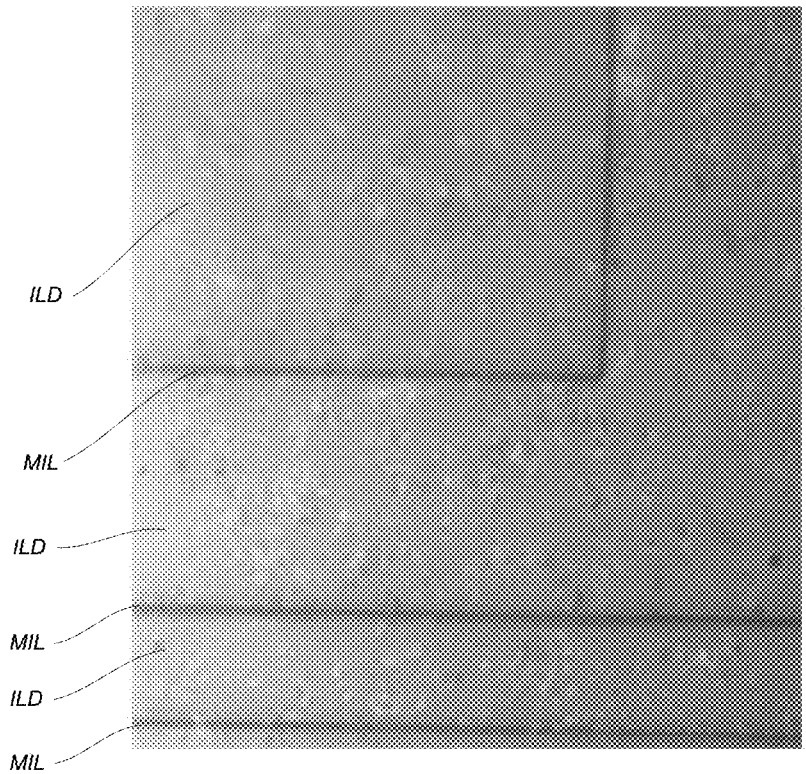

It should be noted that the final product of method 110 may be an assembly comprising MIL 250 and engineered template 210. Engineered template 210 is used to support MIL 250 prior to transferring MIL 250 to a device substrate, which may be performed in a different method by a different entity. However, one having ordinary skill in the art would understand that when MIL 250 is removed from engineered template 210, engineered template 210 may be reused in method 110 to form another MIL, having the same design. This reuse of engineered template 210 is schematically shown in FIGS. 3D, 3J, and 4D.

It should be also noted that the same engineered template 210 may support multiple MILs having the same or different designs. Each of these MILs may be removed individually from engineered template 210, e.g, for transferring to the corresponding device substrate. The alignment of the individual MILs to the corresponding device substrate is achieved during the transfer and is not limited by the initial positioning of these MILs on engineered template 210. As such, the position of different MILs on engineered template 210 can be selected, e.g., to achieve higher utilization of engineered template 210 and other factors.

Example of Integrating MILs to Device Substrates

Figure 5:
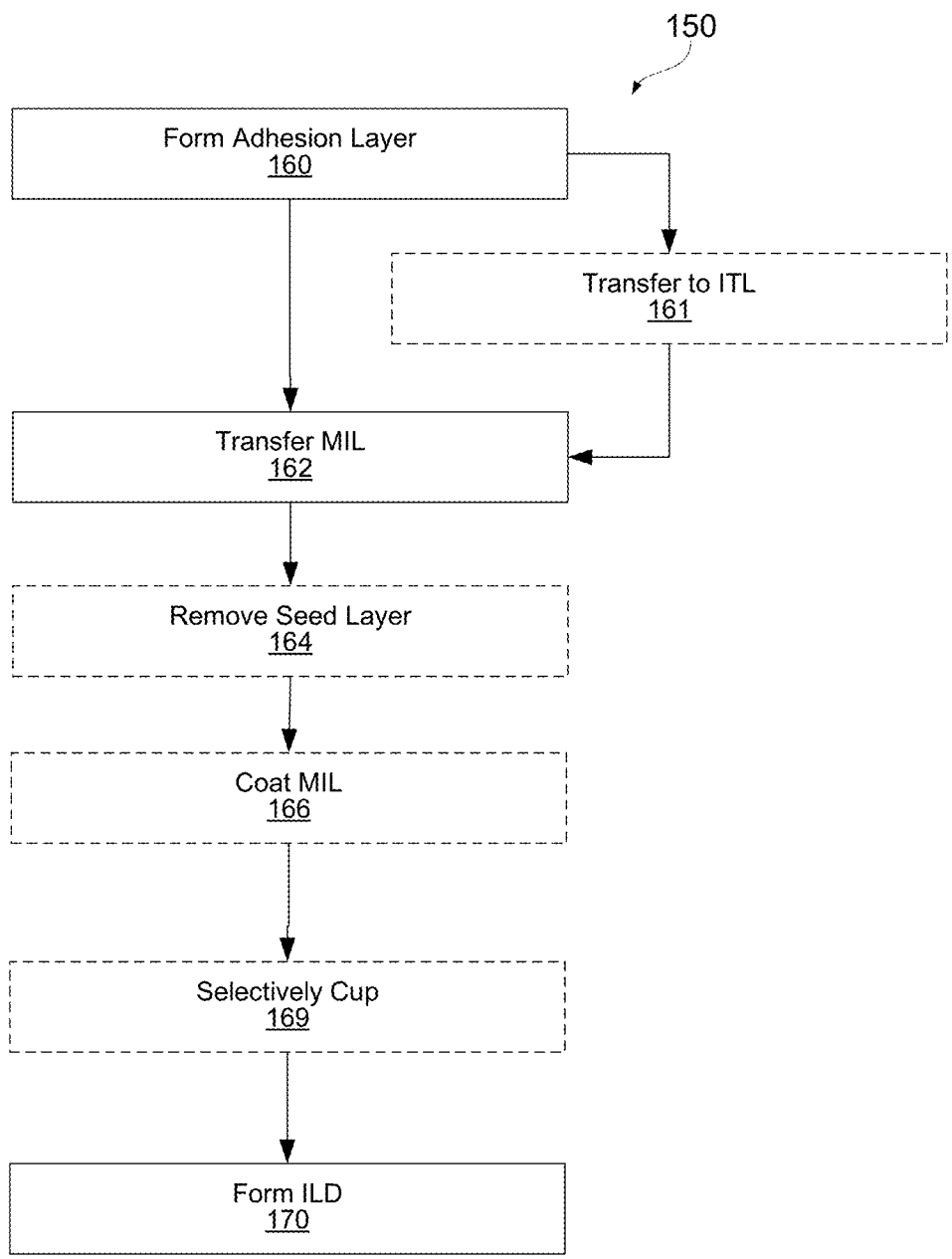
FIG. 5 is a process flowchart corresponding to a method of integrating a MIL to a device substrate, in accordance with some examples.

FIG. 5 is a process flowchart corresponding to method 150 of integrating MIL 250 to device substrate 290, in accordance with some examples. Method 150 may be performed for the entire workpiece surface (e.g., matching of device substrate 290 and engineered template 210) as well as for any selected part of device substrate 290 (e.g., a die in the case of semiconductor devices). For example, one device substrate 290 may receive multiple MILs at different positions. As noted above, method 150 may be performed independently and by a different entity from method 110 thereby allowing more reduced cost, simplified integration, limited design sharing, and wide range of usable materials for interconnects and interlayer dielectrics.

In some examples, method 150 comprises forming (block 160) adhesion layer 292 on device substrate 290 as, e.g., is schematically shown in FIG. 6B. Adhesion layer 292 comprises at least one of, adhesion promoters such are HMDS (hexamethyldisilazane), Ti-Prime and diphenylsilanediol-derivatives (AR 300-80) HMDS is vapour-deposited or applied from a nitrogen rinse onto the heated wafers (80-150° C.), followed by chemical binding of HMDS to the wafer surface as monolayer. Diphenylsilanediol is dissolved in a solvent mixture and applied by spin coating. In the subsequent bake step (160-180° C.), the silicon-organic compound melts and forms a thin, adhesion-promoting film. Adhesion layer 292 has a thickness of between about 0.5 nm and 50 nm.

In some examples, adhesion layer 292 comprises a material with double functional groups, with one of the groups of high affinity to substrate material (silicon) and the second functional group providing high adhesion to interconnect material. One example of such materials is (3-Mercaptopropyl)trimethoxysilane (MPTS).

It should be noted that adhesion layer 292 is optional and, in some examples, MIL 250 directly contacts the bulk portion of device substrate 290. In other examples, an adhesive layer may be formed on the assembly of engineered template 210 and MIL 250. In more specific examples, an adhesive layer is selectively formed on MIL 250 (e.g., similar to a capping layer described above).

In some examples, method 150 comprises direct transferring (block 162) MIL 250 from engineered template 210 to device substrate 290. For example, this transferring operation may involve stacking engineered template 210, comprising MIL 250, and device substrate 290, comprising adhesion layer 292, such that MIL 250 contacts adhesion layer 292 or, directly, to device substrate 290. This stack is schematically shown in FIG. 6B. During this stacking operation, MIL 250 adheres to device substrate 290. As noted above, the adhesion strength between MIL 250 and device substrate 290 is greater than between MIL 250 and engineered template 210. More specifically, the adhesion strength between MIL 250 and device substrate 290 is greater than between seed layer 220 and engineered template 210, at least when seed layer 220 is positioned between MIL 250 and engineered template 210.

In some examples, seed layer 220 provides an envelope for the transfer of any structures (e.g., MIL 250 and potentially other structures), which are formed over seed layer 220. More specifically, these structures are separated from engineered template 210 by seed layer 220 thereby allowing the separation of the structures from engineered template 210. As noted above, seed layer 220 controls the adhesion to engineered template 210 and responsible for the transfer of these structures from engineered template 210 to device substrate 290. It should be noted that any type of structures can be formed over seed layer 220, such as multi-layered structures, active elements (e.g., transistors, diodes, solar cells, and the like). This envelope can be transferred as a whole, thereby maintaining the internal arrangements within these structures and also the external arrangement among the structures.

The transferring operation then proceeds with separating engineered template 210 from device substrate 290 while MIL 250 is retained by adhesion layer 292 on device substrate 290 (because of the difference in the adhesion strength described above). This part of the operation is schematically shown in FIG. 6C. After the transferring operation, MIL 250 protrudes above device substrate 290. For this transfer method, the desired MIL pattern is converted into a mirror image, also with consideration that via structures in engineered template 210 protrudes upright after the pattern transfer.

In some examples, method 150 comprises transferring (block 161) MIL 250 from engineered template 210 to device substrate 290 using, e.g., an intermediate transfer layer (ITL). The ITL comprises a flexible or rigid substrate with an adhesive coating. In some examples, the adhesion of the ITL is chosen to be lower than the adhesion of device substrate 290. In other examples, the ITL is chosen from materials with a controlled adhesion strength, e.g., with adhesion strength variation provided by the application of UV radiation and/or heat. The adhesion strength between MIL 250 and the ITL could be highest when MIL 250 is transferred from engineered template 210 to the ITL and, later, significantly reduced for the transfer from the ITM to device substrate 290. For this method of MIL transfer, the template pattern is the same as desired MIL pattern on device substrate 290 (not a mirror image).

In some examples, method 150 comprises removing (block 164) seed layer 220 from MIL 250 as, e.g., is schematically shown in FIG. 6D. The seed layer removal may involve wet etch or dry etch. Any etching process is applicable after the selective electrodeposition, which prevents the metal deposition in the field area. In these examples, the undesired material between MIL 250 (between the lines) is very thin (e.g., the seed layer thickness) and can be easily removed before affecting the thickness of MIL 250.

In some examples, method 150 comprises coating (block 166) of the transferred MIL with a special material to improve the interconnect performance. An example of such improvements is the selective cobalt coating of copper lines, which may be also referred to as selective capping. Cobalt capping reduces the electromigration of copper in interconnects, also preventing copper diffusion into dielectric layers. Cobalt capping is formed, e.g., selectively on MIL 250 by an electroless deposition process. An example of capping layer 260 is shown in FIG. 6E.

In some examples, method 150 comprises forming (block 170) an interlayer dielectric (ILD) over MIL 250, while MIL 250 is disposed over device substrate 290. An example of ILD 270 is shown in FIG. 6F. The ILD formation, as a second step after the MIL transfer, enables using different methods and structures such as: (a) silicon oxide coating with following CMP step if necessary; (b) Spin-on Dielectric fabrication with desired thickness to open the interlayer contact areas; (c) Low-k material deposition (d) formation air-gap structures.

In some examples, device substrate 290 comprises conductive features 294 as, e.g., is schematically shown in FIG. 6G. In these examples, conductive features 294 are aligned with the features of MIL 250 to form electrical connections between at least some of these features. In more specific examples, MIL 250 is disposed between two device substrates, each comprising conductive features, e.g., device substrate 290 with conductive features 294 and additional device substrate 291 with additional conductive features 293. In these examples, at least some conductive features of MIL 250 may form electrical connections with both at least a subset of conductive features 294 and at least a subset of additional conductive features 293 as, e.g., is schematically shown in FIG. 6G.

Examples of Experimental Verification of MIL Formation and Transfer

Various experiments were performed to show the feasibility of methods of forming MILs on engineered templates and transferring these MILS to a device substrate. In one experiment, a template was formed on a 200-mm silicon oxide wafer (base) by etching SEMI 854 pattern structures using a lithography process. A 75-nm thick copper seed layer was deposited using a PVD process. The copper seed layer was selectively coated at the field areas with a blocking layer, which may be also referred to as a protective agent. This protective agent prevents the electrochemical deposition of copper in the areas covered by the agent and facilitates the "trench only" deposition. The template was subjected to an electrochemical deposition of copper on limited 2-inch diameter surface areas. The seed layer of copper was etched back (between the MILs features) at least partially by the application of the reverse polarity at the end of the deposition. This seed layer removal resulted in the exposure of the underlayer template surface.

Figure 7B:
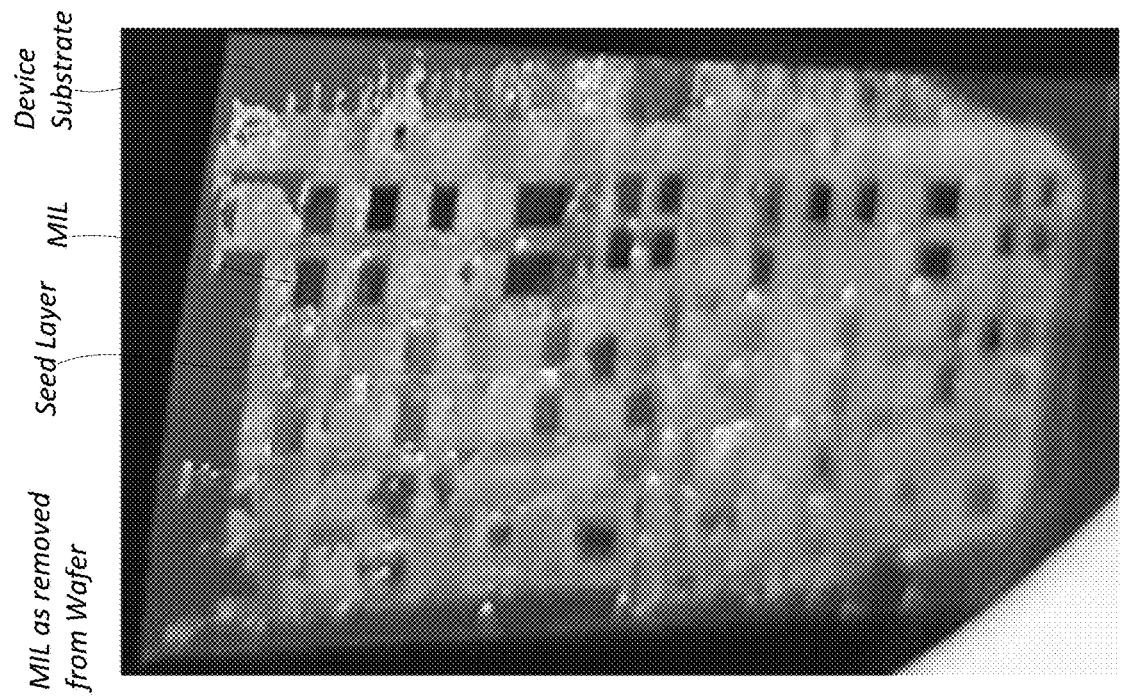
FIG. 7B is a photograph of a MIL, manufactured using the engineered template of FIG. 7A, after removing the MIL from the engineered template and positioning on a device substrate but before removing a seed layer.
Figure 7A:
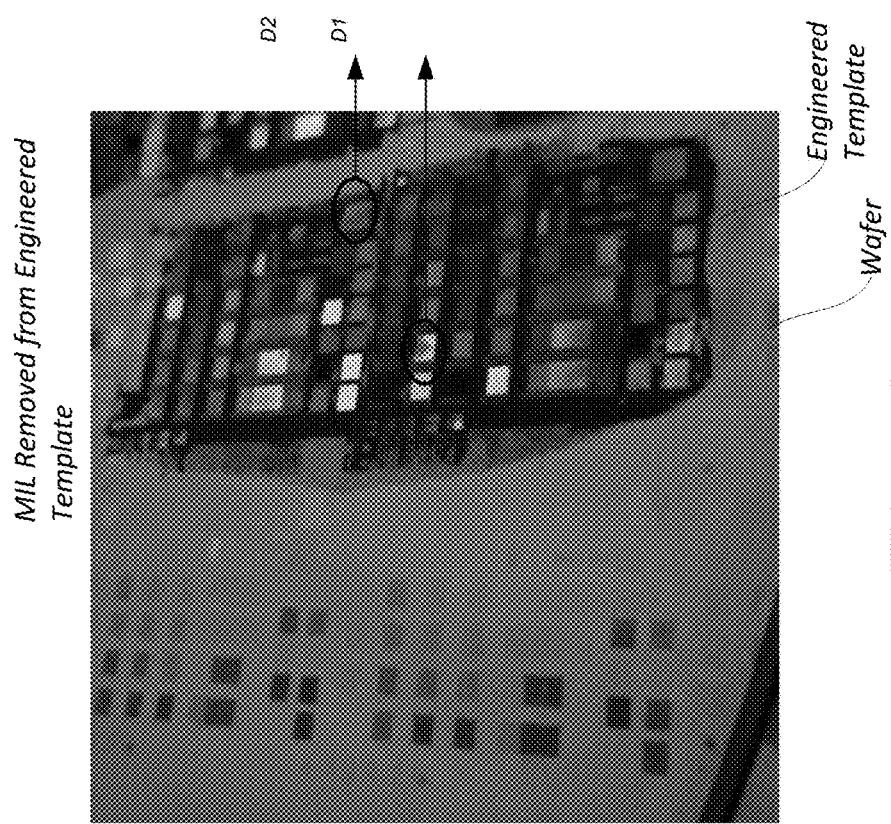
FIG. 7A is a photograph of an engineered template used to manufacture a MIL shown in FIGS. 7A-7E.
Figure 7D:
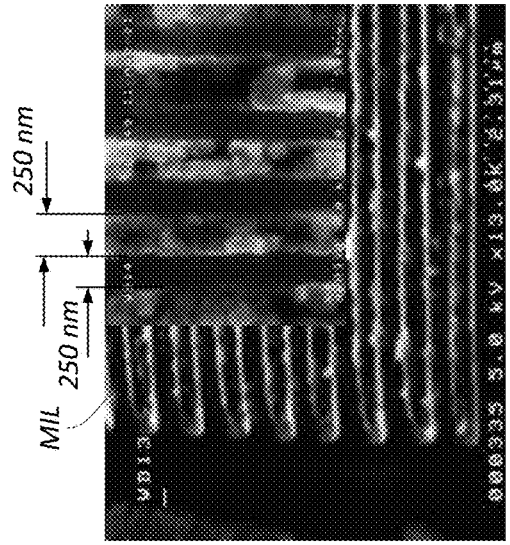
FIGS. 7D and 7E are higher magnification photos of two portions of the MIL shown in FIG. 7C.
Figure 7E:
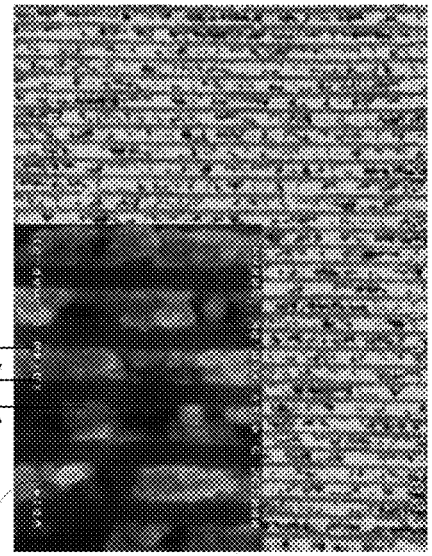
Figure 7C:
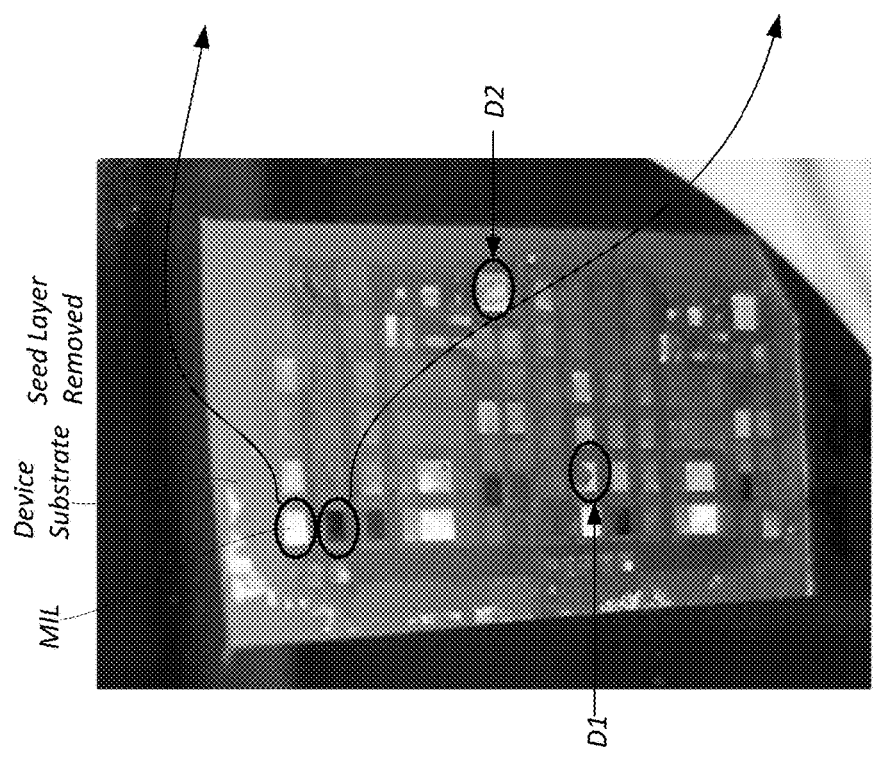
FIG. 7C is a photograph of the MIL from FIG. 7B, after removing the seed layer.

FIG. 7A is a photograph of an engineered template used in this experiment. This engineered template comprises 4 separate visible dies. It should be noted that a typical wafer can contain any number of dies, each of which can be considered as a different MIL and transferred separately with the precise alignment at the end of the transfer on the device substrate. The MIL template is not shown in this photograph. FIG. 7A identifies two areas (D1 and D2) on the engineered template, which have distinctive designs. FIG. 7B is a photograph of a MIL, manufactured using the engineered template of FIG. 7A. Specifically, FIG. 7B illustrates the MIL after removing the MIL from the engineered template and positioning the MIL on a device substrate, which is a transparent plastic film in this example. The MIL, shown in FIG. 7B, is still with a seed layer. FIG. 7C is a photograph of the MIL from FIG. 7B, after removing the seed layer. FIG. 7C shows a clear separation between different features of the MIL. Furthermore, FIG. 7C also identifies two areas (D1 and D2), corresponding to the areas on the engineered template identified in FIG. 7A. The distinctive designs of the engineered template are visible in the corresponding features of the MIL. FIGS. 7D and 7E are higher magnification photos of two portions of the MIL shown in FIG. 7C.

Figure 8A:
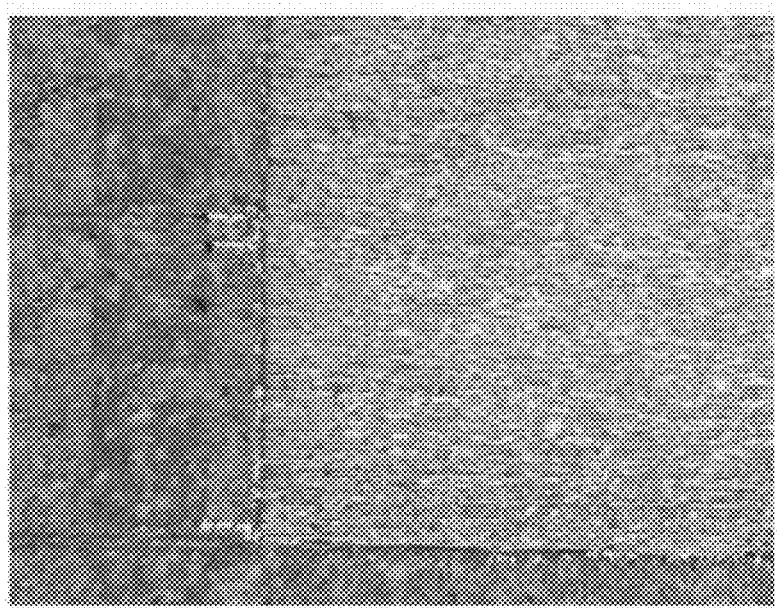
FIGS. 8A and 8B represent optical images of a transferred metal interconnect layer on the adhesive tape surface at different optical magnifications.
Figure 8B:
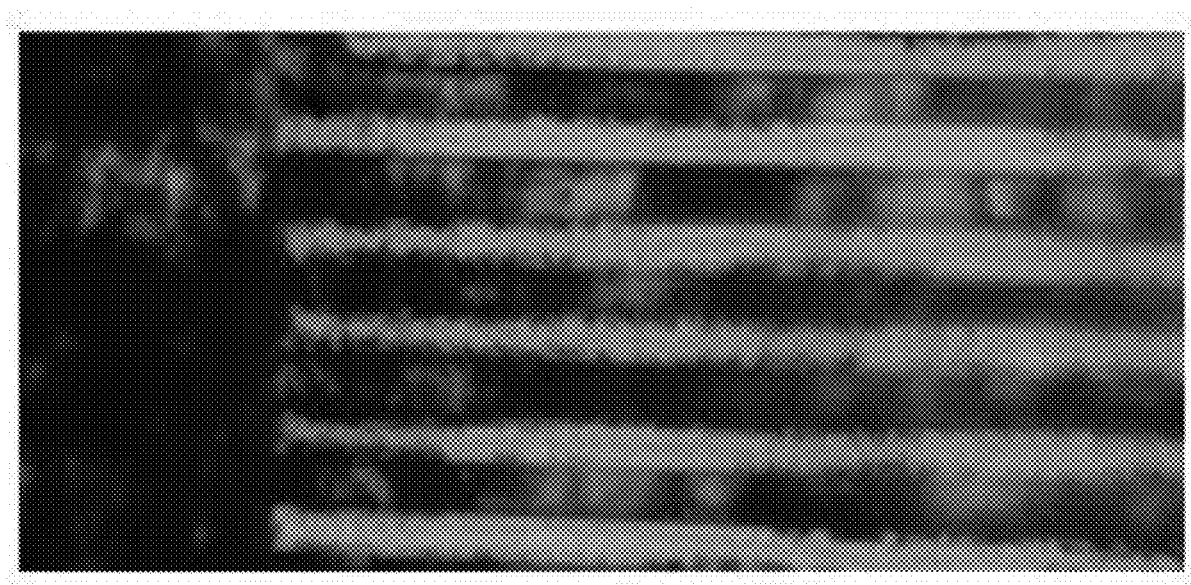

FIGS. 8A and 8B represent optical images of a transferred MIL on an adhesive tape surface at different optical magnifications. The copper seed layer was removed from this MIL (before the transfer), and FIG. 8B shows clearly separated copper lines. This image confirms an acceptable quality of the MIL in the micron size range on a flexible substrate.

Figure 9A:
FIGS. 9A and 9B illustrate an optical image of a MIL on an adhesive tape surface and a surface profile measurement for this sample.
Figure 9B:
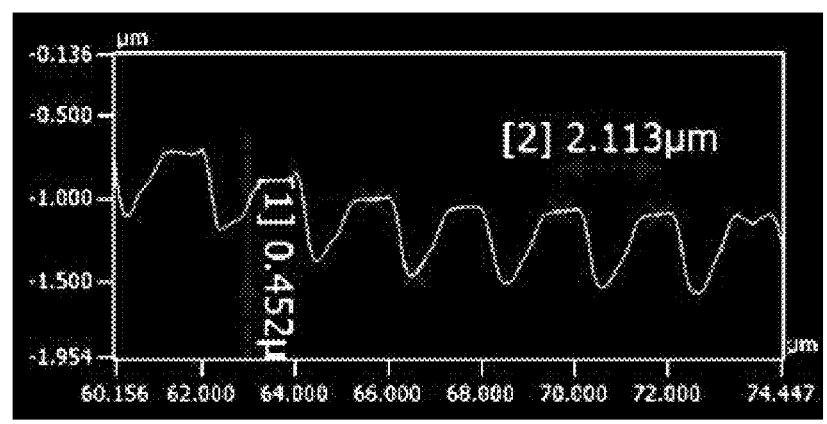
Figure 9C:
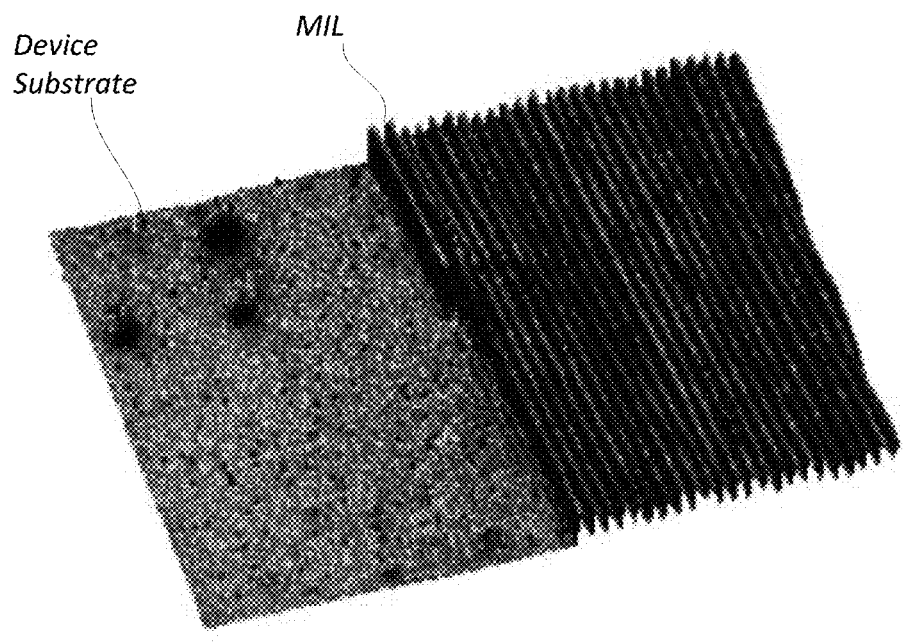
FIGS. 9C and 9D illustrate another image of a MIL a surface profile measurement for this sample.
Figure 9D:
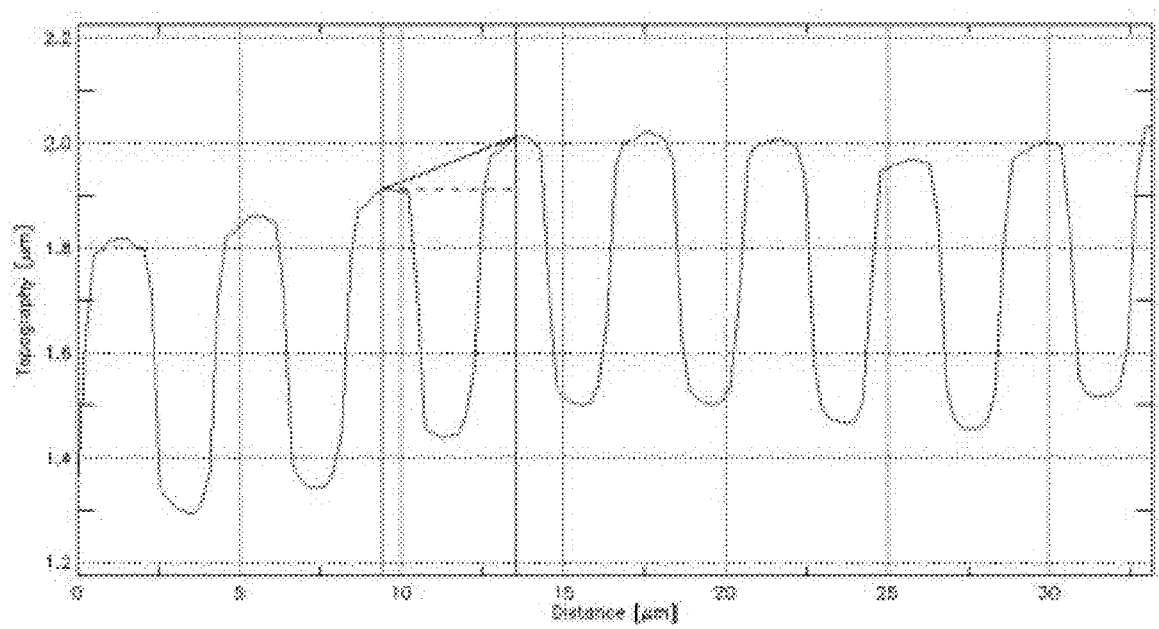

FIG. 9A is an optical image of a MIL on an adhesive tape surface. FIG. 9B is a corresponding surface profile, obtained by a laser confocal microscope. The seed layer of copper was not removed from the MIL before the transfer. FIG. 9C is an optical image of another MIL on an adhesive tape surface. FIG. 9D is a corresponding surface profile, obtained by a laser confocal microscope. This data also demonstrates a good quality of MIL formation in the micron size range on a flexible substrate.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatus. Accordingly, the present examples are to be considered illustrative and not restrictive.

What is claimed is:

1. A method of forming a transferable metal interconnect layer (MIL), having a MIL design, for transferring to a device substrate, the method comprising:
depositing a seed layer on an engineered template, the engineered template comprising template features determined by the MIL design of the transferable MIL; and
selectively electroplating the transferable MIL into the template features over the seed layer,
wherein adhesion of the seed layer to the engineered template is below an adhesion threshold, corresponding to the device substrate, thereby allowing to transfer the transferable MIL from the engineered template to the device substrate while retaining the MIL design of the transferable MIL.

2. The method of claim 1, wherein the engineered template comprises a base material, and wherein the seed layer directly interfaces the base material of the engineered template.

3. The method of claim 1, wherein:
the engineered template comprises a base portion and a conductive portion,
the template features are formed within the base portion, and
one or more of the template features protrudes to the conductive portion such that the conductive portion forms bottoms of the one or more of the template features.

4. The method of claim 3, wherein:
the base portion of the engineered template comprises silicon oxide, and
the conductive portion of the engineered template comprises a low-resistivity silicon wafer.

5. The method of claim 1, wherein the seed layer and the transferable MIL are formed from substantially similar materials.

6. The method of claim 1, wherein the seed layer and the transferable MIL are formed from different materials.

7. The method of claim 1, further comprising, prior to depositing the seed layer on the engineered template, forming an adhesion-control layer on the engineered template.

8. The method of claim 7, wherein the adhesion-control layer is formed by depositing a silicon oxide layer over the engineered template, chemical treatment, or plasma treatment of the engineered template.

9. The method of claim 1, further comprising, after depositing the seed layer on the engineered template, forming a blocking layer over the seed layer, wherein:
the seed layer comprises first portions, second portions, and third portions,
the first portions of the seed layer are disposed on a field of the engineered template and are covered with the blocking layer,
the second portions of the seed layer are disposed on sidewalls of the template feature and are free from the blocking layer and remain exposed after depositing the blocking layer,
the third portions of the seed layer are disposed on the bottoms of the template feature and are covered with the blocking layer, and
the transferable MIL is selectively electroplated over the second portions of the seed layer and not over the blocking layer.

10. The method of claim 1, further comprising transferring the MIL from the engineered template.

11. The method of claim 1, wherein the engineered template is in a form of a roll, and wherein at least one of depositing the seed layer or selectively electroplating the transferable MIL is performed in a roll-to-roll manner.

12. The method of claim 10, wherein transferring the MIL from the engineered template comprises:
stacking the engineered template, comprising the transferable MIL, and the device substrate such that the transferable MIL contacts the device substrate, and
separating the engineered template from the device substrate while the transferable MIL is retained by the device substrate and while the transferable MIL maintains a MIL design on the device substrate set by the engineered template.

13. The method of claim 10, wherein transferring the MIL from the engineered template further comprises forming an adhesion layer on the device substrate such that, when stacking the engineered template and the device substrate, the transferable MIL contacts the adhesion layer of the device substrate.

14. The method of claim 10, wherein:
the engineered template and the transferable MIL form a stack further comprising a seed layer,
after transferring the transferable MIL from the engineered template to the device substrate, the transferable MIL is covered by the seed layer, and
the method further comprises, after transferring the transferable MIL from the engineered template to the device substrate, removing the seed layer of the transferable MIL thereby exposing the transferable MIL.

15. The method of claim 10, wherein transferring the MIL from the engineered template further comprises forming a selective capping layer on the transferable MIL such that the device substrate remains free from the selective capping layer.

16. The method of claim 1, wherein the engineered template comprises silicon dioxide, forming the surface of the template features.

17. The method of claim 1, wherein the engineered template is free from a barrier layer.

* * * * *